US009142551B2

(12) United States Patent
Shimizu et al.

(10) Patent No.: US 9,142,551 B2
(45) Date of Patent: Sep. 22, 2015

(54) SEMICONDUCTOR DEVICE HAVING A PAIR OF TRANSISTORS THAT ARE DIRECTLY COUPLED AND CAPACITIVELY COUPLED

(71) Applicant: Kabushiki Kaisha Toshiba, Minato-ku (JP)

(72) Inventors: Tatsuo Shimizu, Shinagawa (JP); Kazuto Takao, Tsukuba (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/605,160

(22) Filed: Jan. 26, 2015

(65) Prior Publication Data

US 2015/0228642 A1 Aug. 13, 2015

(30) Foreign Application Priority Data

Feb. 7, 2014 (JP) ................................. 2014-022325

(51) Int. Cl.
*H01L 27/06* (2006.01)
*H01L 21/8228* (2006.01)
(Continued)

(52) U.S. Cl.
CPC ...... *H01L 27/0629* (2013.01); *H01L 21/82285* (2013.01); *H01L 27/0635* (2013.01); *H01L 29/732* (2013.01); *H01L 29/7371* (2013.01)

(58) Field of Classification Search
CPC ............ H01L 27/0629; H01L 27/0635; H01L 21/82285; H01L 29/732; H01L 29/7371
See application file for complete search history.

(56) References Cited

U.S. PATENT DOCUMENTS

2007/0241367 A1* 10/2007 Ouyang et al. ................. 257/190
2008/0087949 A1* 4/2008 Maruoka et al. ............... 257/330
(Continued)

FOREIGN PATENT DOCUMENTS

JP 2001-274322 A 10/2001
JP 2007-012721 A 1/2007
(Continued)

OTHER PUBLICATIONS

"Parasitic oscillation "ringing" to turn off new technology—Successful high-speed switching low-loss SiC inverter continuous operation Power density to 40 kW/liter" Press Release, FUPET, Oct. 3, 2011, 4 pages (with English Abstract).

*Primary Examiner* — Kevin Parendo
(74) *Attorney, Agent, or Firm* — Oblon, McClelland, Maier & Neustadt, L.L.P.

(57) ABSTRACT

According to one embodiment, a semiconductor element includes a first transistor section, a second transistor section, a contact region, and a capacitive element section. The first transistor section includes a first electrode, a second electrode, a first semiconductor region, a second semiconductor region, a third semiconductor region, the third semiconductor region, and the third semiconductor region being connected to the second electrode, and a third electrode. The second transistor section includes a fourth electrode, a fifth electrode, a fourth semiconductor region, a fifth semiconductor region, a sixth semiconductor region, and the sixth semiconductor region being connected to the fifth electrode, and a sixth electrode, the second transistor section being arranged adjacent to the first transistor section. The contact region includes a seventh electrode, electrically connecting the fifth electrode and the first electrode. The capacitive element section is connected between the second electrode and the fourth electrode.

16 Claims, 15 Drawing Sheets

(51) Int. Cl.
*H01L 29/732* (2006.01)
*H01L 29/737* (2006.01)

(56) References Cited

U.S. PATENT DOCUMENTS

| | | | |
|---|---|---|---|
| 2009/0040724 A1 | 2/2009 | Nishikimi et al. | |
| 2010/0327654 A1 | 12/2010 | Azuma et al. | |
| 2011/0285226 A1 | 11/2011 | Fujita et al. | |
| 2014/0084993 A1 | 3/2014 | Takao et al. | |
| 2014/0166971 A1* | 6/2014 | Park | 257/5 |
| 2015/0021664 A1* | 1/2015 | Simin et al. | 257/192 |
| 2015/0035051 A1* | 2/2015 | Hebert | 257/334 |

FOREIGN PATENT DOCUMENTS

| | | |
|---|---|---|
| JP | 2009-071962 A | 4/2009 |
| JP | 2009-225612 A | 10/2009 |
| JP | 2010-041828 A | 2/2010 |
| JP | 2010-063355 A | 3/2010 |
| JP | 2010-124691 A | 6/2010 |
| JP | 2010-193713 A | 9/2010 |
| JP | 2011-015460 A | 1/2011 |
| JP | 2011-023570 A | 2/2011 |
| JP | 2011-172442 A | 9/2011 |
| JP | 2011-239679 A | 11/2011 |
| JP | 2011-250491 A | 12/2011 |
| JP | 2014-067760 A | 4/2014 |

* cited by examiner

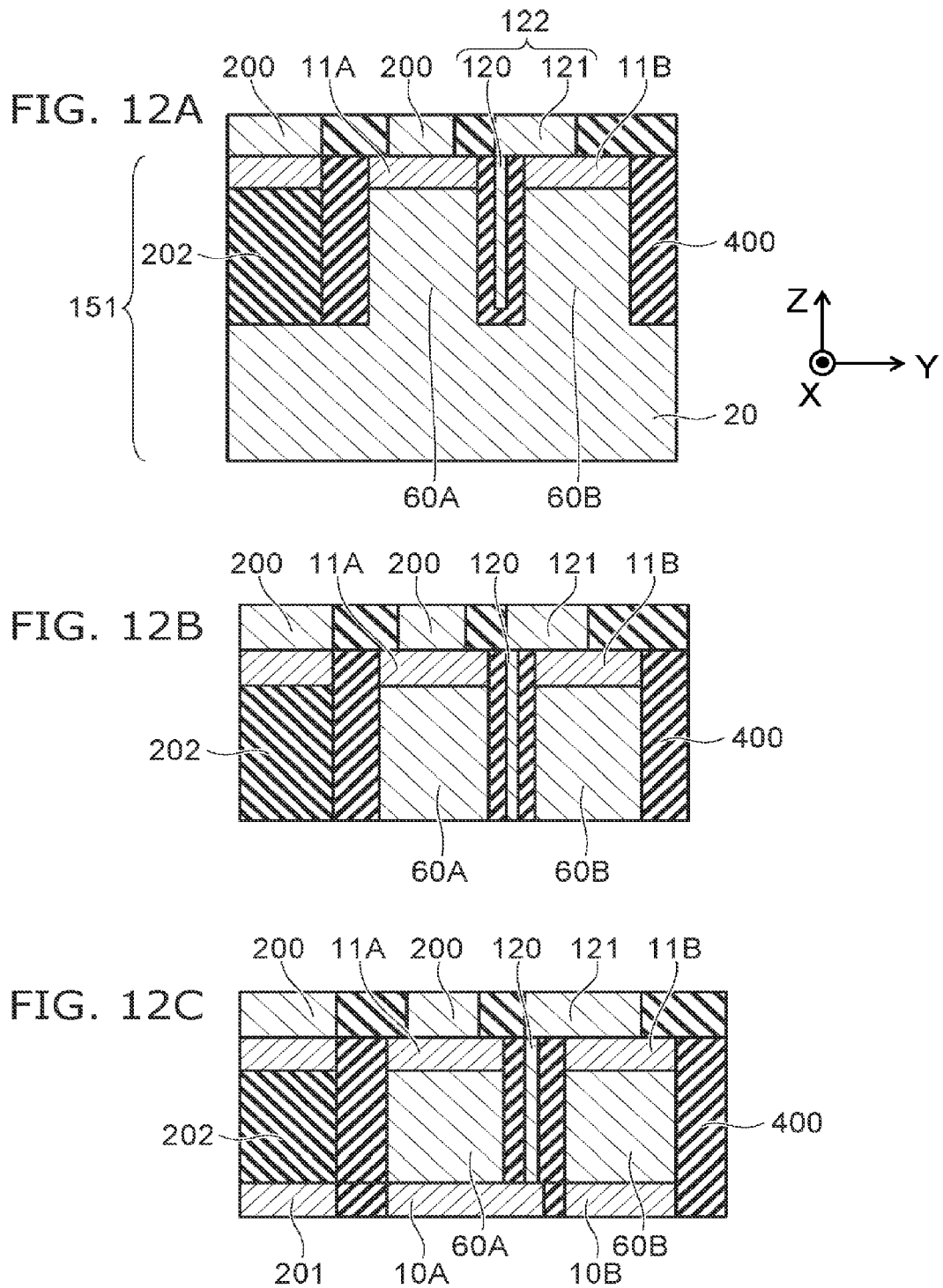

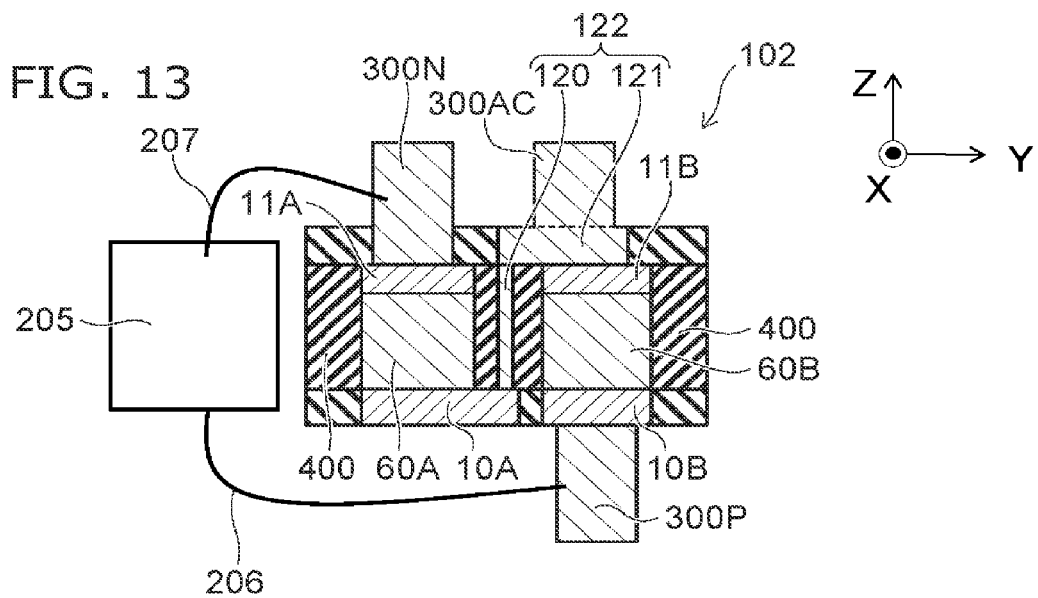
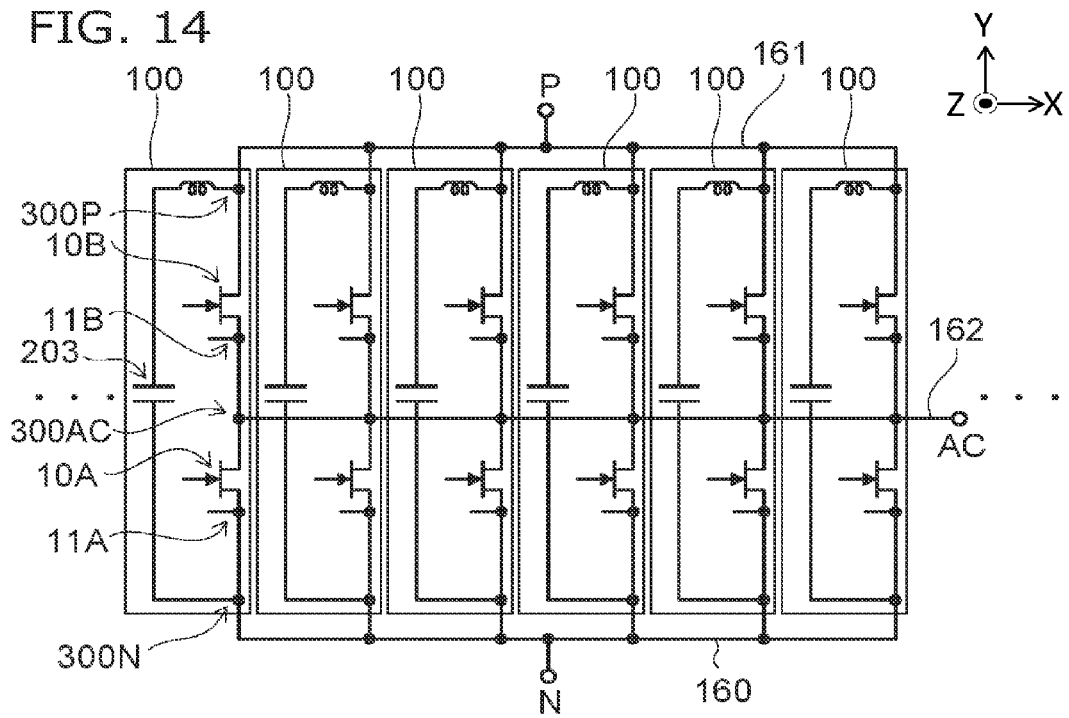

US 9,142,551 B2

SEMICONDUCTOR DEVICE HAVING A PAIR OF TRANSISTORS THAT ARE DIRECTLY COUPLED AND CAPACITIVELY COUPLED

CROSS-REFERENCE TO RELATED APPLICATIONS

This application is based upon and claims the benefit of priority from Japanese Patent Application No. 2014-022325, filed on Feb. 7, 2014; the entire contents of which are incorporated herein by reference.

BACKGROUND

There is a parasitic inductance in a wiring of a semiconductor device, and when a semiconductor element switches, an induction voltage will be generated, which is expressed by the product of the parasitic inductance and the current change rate (di/dt) at switching. Thus, a DC voltage of an electric power inverter circuit and the induction voltage will be applied to the semiconductor device. In order to enhance the reliability of the semiconductor device, it is important to reduce such a parasitic inductance as low as possible. Further, in order to downsize the semiconductor device, it is also important to scale down the semiconductor device.

BRIEF DESCRIPTION OF THE DRAWINGS

FIGS. 12A to 12C are schematic cross-sectional views showing a manufacturing process of the semiconductor device according to the second embodiment;

FIG. 13 is a schematic cross-sectional view showing a semiconductor element according to a third embodiment;

FIG. 14 is a schematic plan view showing a semiconductor device according to a first example of a fourth embodiment;

DETAILED DESCRIPTION

Figure 1A:
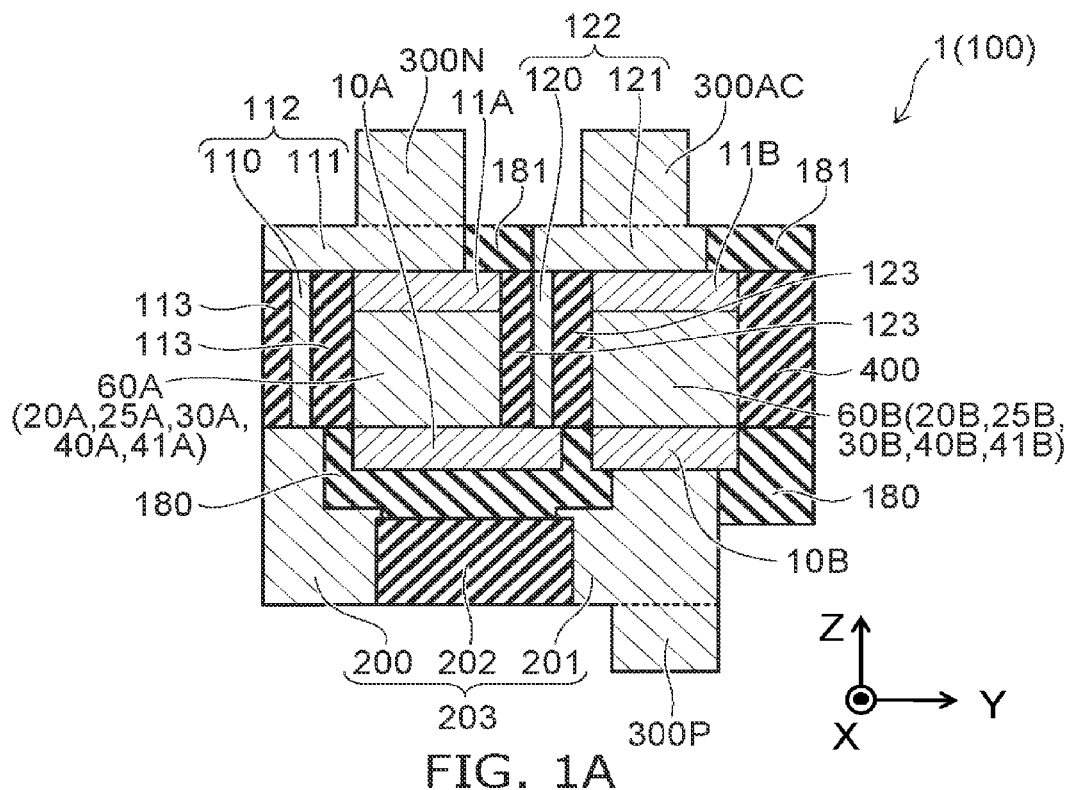
FIG. 1A is a schematic cross-sectional view showing a semiconductor device according to a first embodiment.

According to one embodiment, a semiconductor element includes a first transistor section, a second transistor section, a contact region, and a capacitive element section.

The first transistor section includes a first electrode, a second electrode, a first conductivity-type first semiconductor region provided between the second electrode and the first electrode, a second conductivity-type second semiconductor region provided between the first semiconductor region and the second electrode, a first conductivity-type third semiconductor region provided between the second semiconductor region and the second electrode, the third semiconductor region having an impurity concentration higher than an impurity concentration of the first semiconductor region, and the third semiconductor region being connected to the second electrode, and a third electrode sandwiching a first insulating film with the first semiconductor region, the second semiconductor region and the third semiconductor region.

The second transistor section includes a fourth electrode arranged adjacent to the first electrode in a first direction, a fifth electrode arranged adjacent to the second electrode in the first direction, a first conductivity-type fourth semiconductor region provided between the fifth electrode and the fourth electrode, a second conductivity-type fifth semiconductor region provided between the fourth semiconductor region and the fifth electrode, a first conductivity-type sixth semiconductor region provided between the fifth semiconductor region and the fifth electrode, the sixth semiconductor region having an impurity concentration higher than an impurity concentration of the fourth semiconductor region, and the sixth semiconductor region being connected to the fifth electrode, and a sixth electrode sandwiching a second insulating film with the fourth semiconductor region, the fifth semiconductor region and the sixth semiconductor region, the second transistor section being arranged adjacent to the first transistor section in the first direction.

The contact region includes a seventh electrode extended in a second direction intersecting with the first direction and the seventh electrode provided between the first semiconductor region and the fourth semiconductor region, the contact region electrically connects the fifth electrode and the first electrode.

The capacitive element section is connected between the second electrode and the fourth electrode.

Embodiments of the invention will now be described with reference to drawings. In the following description, the same reference numeral is given to the same member and the description is omitted regarding to a member described once as appropriate.

First Embodiment

Figure 1B:
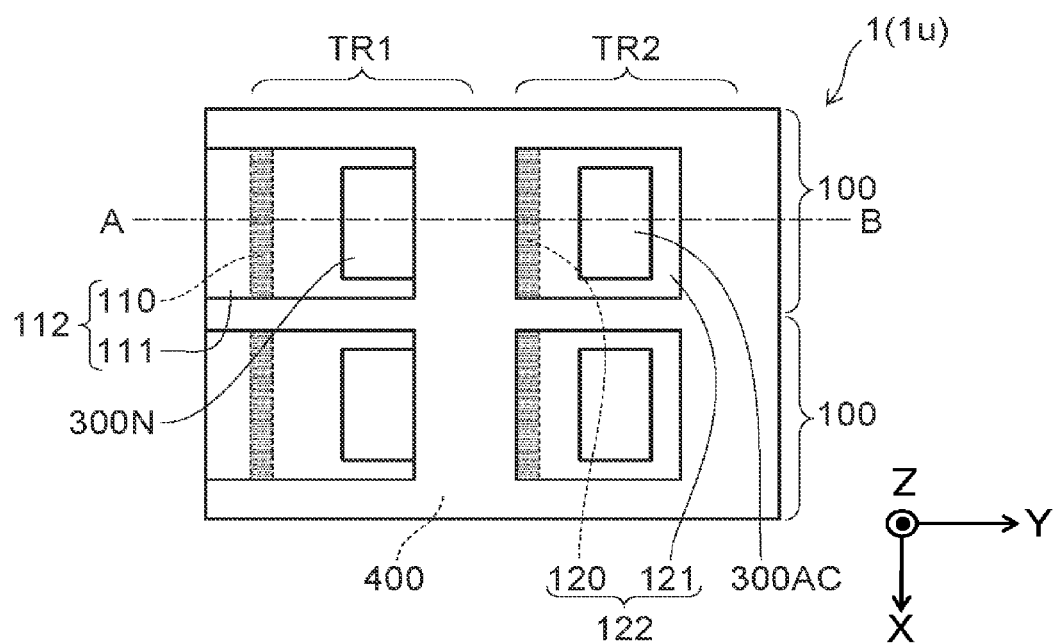
FIG. 1B is a schematic plan view showing the semiconductor device according to the first embodiment.

FIG. 1A is a schematic cross-sectional view showing a semiconductor device according to the first embodiment, and FIG. 1B is a schematic plan view showing the semiconductor device according to the first embodiment. In FIG. 1A, a cross-section along a line A-B in FIG. 1B is represented.

Figure 2:
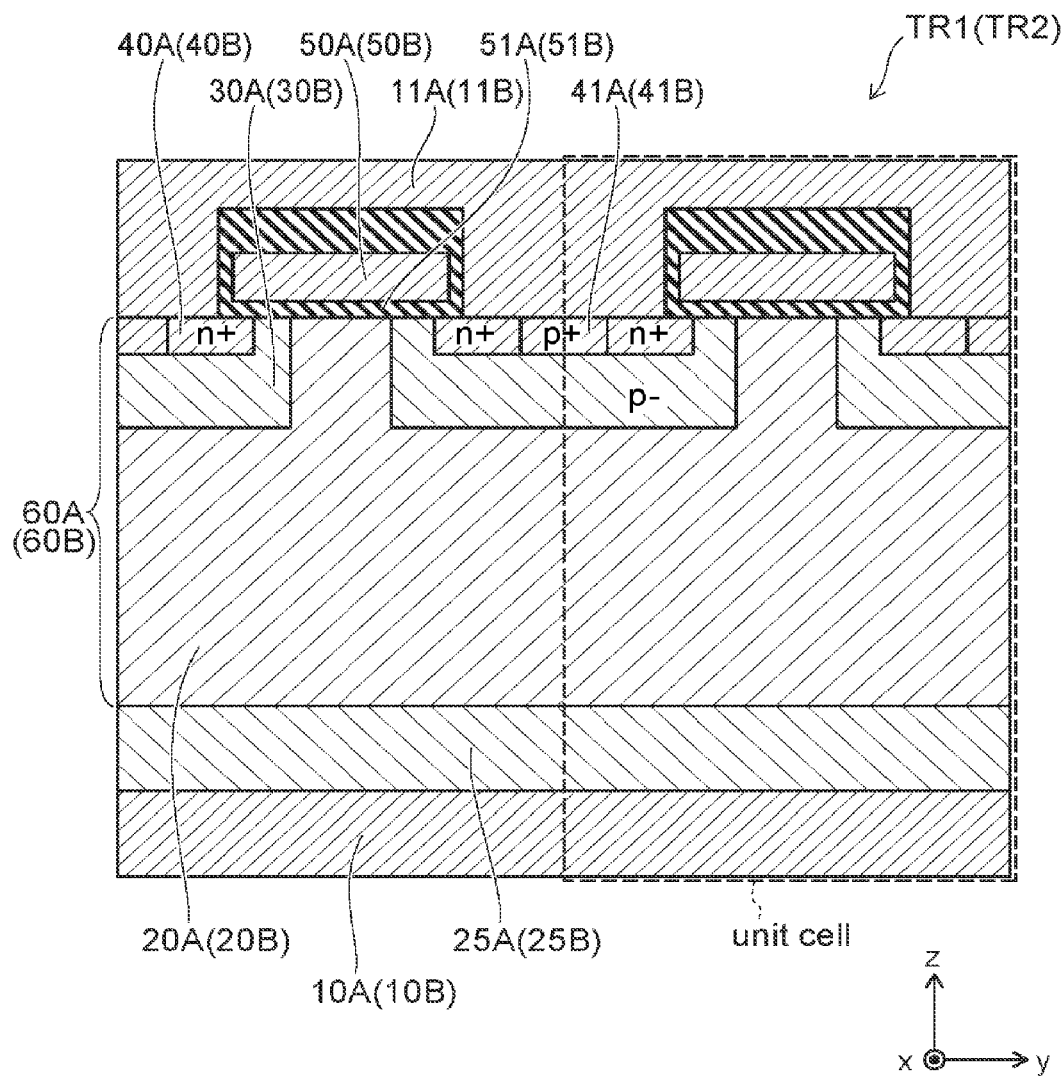
FIG. 2 is a schematic cross-sectional view showing an internal structure of the semiconductor device according to the first embodiment.

FIG. 2 is a schematic cross-sectional view showing the internal structure of the semiconductor device according to the first embodiment.

The semiconductor device 1 according to the first embodiment can form an inverter circuit as one example of an electronic circuit. The semiconductor device 1 is also called as a semiconductor module. The semiconductor device 1 has two semiconductor elements 100 arranged in Y-direction. One of the two semiconductor elements 100 has a transistor section TR1 (first transistor section), and the other has a transistor section TR2 (second transistor section).

Both of the transistor section TR1 and the transistor section TR2 have, for example, a MOSFET (Metal Oxide Semiconductor Field Effect Transistor) having the same structure. In FIG. 2, a part surrounded by a dashed line is a smallest unit (unit cell) of the MOSFET included in the transistor section TR1 (or the transistor section TR2).

First, the MOSFET included in the transistor section TR1 (or TR2) will be described with reference to FIG. 2.

In the transistor section TR1, a source electrode 11A (a second electrode) is provided above a drain electrode 10A (a first electrode). An n-type (first conductivity-type) drift region 20A (a first semiconductor region) is provided between the source electrode 11A and the drain electrode 10A. An $n^+$-type buffer region 25A is provided between the drift region 20A and the drain electrode 10A. An impurity concentration of the buffer region 25A is higher than that of the drift region 20A.

A p-type (second conductivity-type) base region 30A (second semiconductor region) is provided between the drift region 20A and the source electrode 11A. An $n^+$-type source region 40A (third semiconductor region) is provided between the base region 30A and the source electrode 11A. An impurity concentration of the source region 40A is higher than that of the drift region 20A. The source region 40A is connected to the source electrode 11A.

A $p^+$-type contact region 41A is provided between the base region 30A and the source electrode 11A. An impurity concentration of the contact region 41A is higher than that of the base region 30A. The source region 40A is connected to the source electrode 11A.

In the first embodiment, a layer including the drift region 20A, the buffer region 25A, the base region 30A, the source region 40A, and the contact region 41A is referred to as a semiconductor containing layer 60A. The semiconductor containing layer 60A is provided between the drain electrode 10A and the source electrode 11A.

A gate electrode 50A (third electrode) is in contact with the drift region 20A, the base region 30A, and the source region 40A via a gate insulating film 51A (first insulating film). Therefore, the gate electrode 50A sandwiches the gate insulating film 51A with the drift region 20A, the base region 30A, and the source region 40A.

There are a plurality of unit cells (UCs) in the transistor section TR1. Current of several to several hundreds of ampere (A) can be flown between the source electrode 11A and the drain electrode 10A. Further, a pn diode (built-in diode) is constructed by the base region 30A and the drift region 20A.

Although, a planar structure gate electrode to be used for the semiconductor element 100 is illustrated, a trench gate structure gate electrode may be used. Further, it is possible to construct an IGBT in the transistor section TR1 by forming a $p^+$-type semiconductor region between the drain electrode 10A and the buffer region 25A. However, since a built-in diode is used in this case, it is difficult to use an IGBT using a p-type substrate. For example, an IGBT formed in a portion of an n-type MOSFET (a portion facing to a MOS channel portion) by ion-implanting of a $p^+$-layer in which a built-in diode can function may be used.

In the transistor section TR2, the drain electrode 10A represented in FIG. 2 becomes a drain electrode 10B (fourth electrode), and the source electrode 11A becomes a source electrode 11B (fifth electrode). Further, the drift region 20A becomes a drift region 20B (fourth semiconductor region), the buffer region 25A becomes a buffer region 25B, and the base region 30A becomes a base region 30B (fifth semiconductor region).

Further, the source region 40A becomes a source region 40B (sixth semiconductor region), and the contact region 41A becomes a contact region 41B. Further, the gate insulating film 51A becomes a gate insulating film 51B (second insulating film), and the gate electrode 50A becomes a gate electrode 50B (sixth electrode). Further, a layer including the drift region 20B, the buffer region 25B, the base region 30B, the source region 40B, and the contact region 41B is referred to as a semiconductor containing layer 60B.

There are also a plurality of unit cells (UCs) in the transistor section TR2. Current of several to several hundreds of ampere (A) can be flown between the source electrode 11B and the drain electrode 10B. Further, a pn diode (built-in diode) is constructed by the base region 30B and the drift region 20B.

The semiconductor material of the transistor sections TR1 and TR2 is SiC, Si, etc., for example.

The semiconductor device represented in FIGS. 1A and 1B will now be described. In FIG. 1A, representation of the gate electrode and the gate insulating film are omitted.

As mentioned above, in the semiconductor device 1, two semiconductor elements 100 are arranged adjacent to each other in X-direction (third direction). In each of the two semiconductor elements 100, the drain electrode 10A and the drain electrode 10B are arranged adjacent to each other in Y-direction. The source electrode 11A and the source electrode 11B are arranged adjacent to each other in Y-direction.

In the semiconductor element 100, a through electrode 120 (seventh electrode) is provided between the drift region 20A and the drift region 20B, for example. The through electrode 120 is provided between a semiconductor containing layer 60A and a semiconductor containing layer 60B and between the source electrode 11A and the source electrode 11B. In other words, the through electrode 120 is provided between transistor section TR1 and transistor section TR2. Insulating layer 123 is provided between the through electrode 120 and the semiconductor containing layer 60A, between the through electrode 120 and the source electrode 11A, between the through electrode 120 and the semiconductor containing layer 60B, and between the through electrode 120 and the source electrode 11B.

The through electrode 120 is extended in Z-direction (second direction) intersecting Y-direction. The through electrode 120 is connected to an electrode 121. The electrode 121 is connected to the source electrode 11B. That is, the source electrode 11B and the drain electrode 10A are electrically connected by a contact region 122 including the through electrode 120 and the electrode 121.

The source electrode 11A is connected to an electrode 111 provided on the source electrode 11A. Further, another through electrode 110 (eighth electrode) is provided from the source electrode 11A toward the side of the drain electrode 10A (however, the source electrode 11A is not connected to the drain electrode 10A, instead, it is connected to the drain electrode 10B via a contact region and a capacitive region (capacitive element section 203), as described later). The through electrode 110 is formed beside the transistor section TR1 on the side opposite to the through electrode 120. The through electrode 110 is electrically connected to the source electrode 11A. The through electrode 110 is extended in Z-direction. That is, the contact region 112 including the electrode 111 and the through electrode 110 is connected to the source electrode 11A and drawn out to the side of the drain electrode 10A. The insulating layer 113 is provided between the through electrode 110 and the semiconductor containing layer 60A and between the through electrode 120 and the source electrode 11A. Further, the insulating layer 113 is also provided on the side opposite to the semiconductor containing layer 60A.

In a case where the source electrode 11B and the drain electrode 10A are electrically connected to each other by the contact region 122, a capacitive element section 203 is connected between the source electrode 11A and the drain electrode 10B. For example, the capacitive element section 203 has electrodes 200 and 201, and has a dielectric body 202 sandwiched between the electrode 200 and the electrode 201. The dielectric body 202 includes a high-k dielectric material. The dielectric body 202 is electrically connected to the source electrode 11A via the contact region 112. In other words, the capacitive element section 203 is connected between the source electrode 11A and the drain electrode 10B via the through electrode 110. The electrode 201 is connected to the drain electrode 10B.

Although, a state where the dielectric body 202 included in the capacitive element section 203 is located on the lower side of the drain electrode 10A is represented in the figure, the dielectric body 202 may be located on the lower side of the drain electrode 10B.

A DC terminal 300N, which is an electrode terminal, is drawn out from the electrode 111, and a DC terminal 300P, which is an electrode terminal, is drawn out from the electrode 201. An AC terminal 300AC, which is an electrode terminal, is drawn out from the electrode 121. The AC terminal 300AC may be electrically connected to the drain electrode 10A instead of the source electrode 11B. In addition, the semiconductor containing layers 60A and 60B, the source electrodes 11A and 11B, and the drain electrodes 10A and 10B are covered with the insulating layers 113, 180, 123, 181 and 400.

Further, positions at which the through electrodes 110 and 120, the source electrodes 11A and 11B, and the drain electrodes 10A and 10B are disposed are not limited to the positions shown in the figure, and they may be changed in X and Y-directions as appropriate.

Further, when a cut surface formed in case of cutting the drift regions 20A and 20B vertically with respect to Z-direction, the drift regions 20A and 20B are surrounded by the insulating layers 400 and 113.

Although the semiconductor device 1 in which a set of two semiconductor elements 100 became one chip (semiconductor chip) is illustrated in FIG. 1B, the semiconductor device 1 may be provided with the sets at a plurality of numbers.

Figure 3:
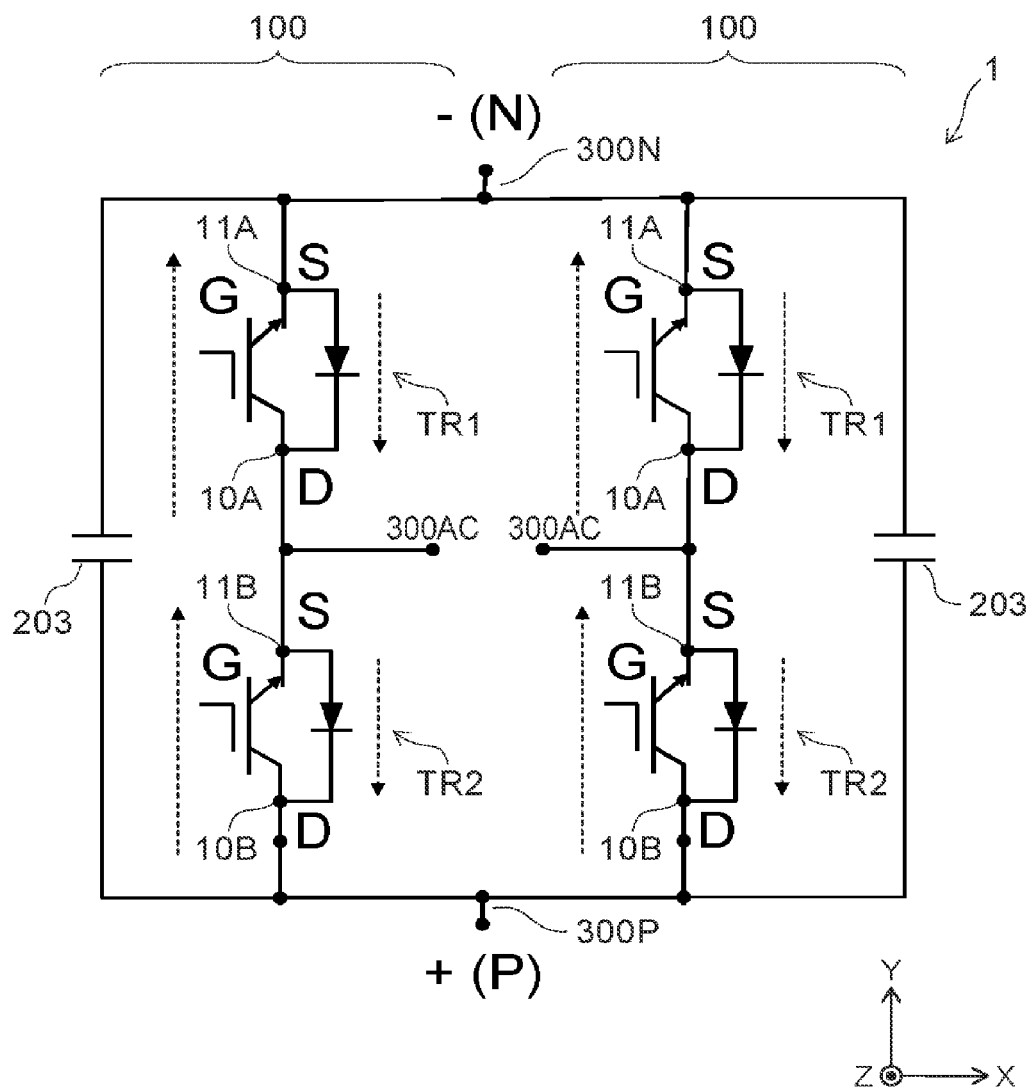
FIG. 3 is an equivalent circuit diagram of the semiconductor device according to the first embodiment.

FIG. 3 is an equivalent circuit diagram of the semiconductor device according to the first embodiment.

In FIG. 3, an inverter circuit for converting a DC voltage into an AC voltage is represented.

In the semiconductor device 1, two semiconductor elements 100 are arranged adjacent to each other in X-direction. In each of the two semiconductor elements 100, the direction from the source electrode 11A to the source electrode 11B (or the direction of a current path through which current flows from the source electrode 11B to the source electrode 11A) is the same direction. In each of the two semiconductor elements 100, the direction from the drain electrode 10A to the drain electrode 10B is the same direction.

Respective DC terminals 300N of the two semiconductor elements 100 are commonalized to be one DC terminal 300N. Further, respective DC terminals 300P of the two semiconductor elements 100 are commonalized to be one DC terminal 300P.

If switching operation between the transistor section TR1 and the transistor section TR2 is controlled as appropriate from an external wiring by applying a negative potential (first polarity potential) to the DC terminal 300N and a positive potential (second polarity potential) to the DC terminal 300P, an AC voltage will be outputted between two AC terminals 300AC. In the figure, how current flows in the transistor section TR1 and the transistor section TR2 is represented by arrows. Further, a built-in pn diode acts as a Free Wheeling Diode.

Figure 4A:
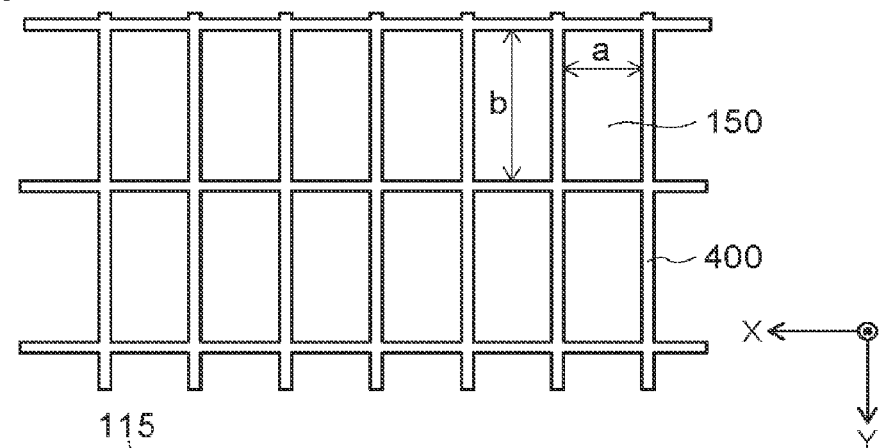
FIGS. 4A to 4C are schematic plan views showing manufacturing process of the semiconductor device according to the first embodiment.
Figure 4B:
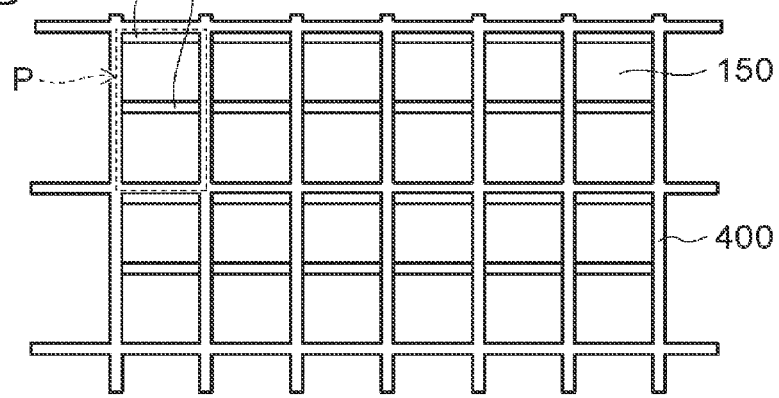
Figure 4C:
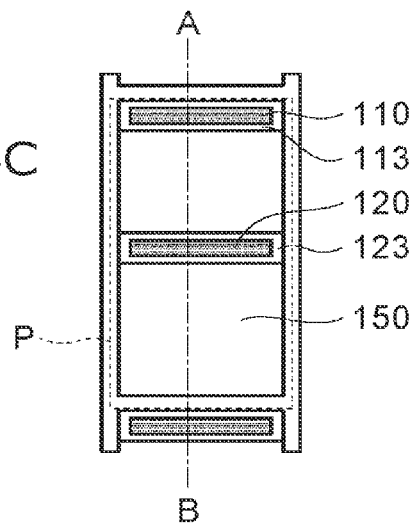

FIGS. 4A to 4C are schematic plan views showing the manufacturing process of the semiconductor device according to the first embodiment.

Before forming the structure represented in FIG. 4A, a structure 150 represented in FIG. 1A is formed, which has: a drift region 20A; a base region 30A provided on the drift region 20A; a source region 40A and a contact region 41A provided on the base region 30A; a source electrode 11A, a gate insulating film 51A, a gate electrode 50A, and a drift region 20B provided on the source region 40A and the base region 30A; a base region 30B provided on the drift region 20B; a source region 40B and a contact region 41B provided on the base region 30B; and a source electrode 11B, a gate insulating film 51B and a gate electrode 50B provided on the source region 40B and the base region 30B.

First, the structure body 150 is partitioned using an insulating layer 400 as represented in FIG. 4A. Here, a trench is dug in a substrate from the surface to the middle, and the insulating layer 400 is buried in the trench. The width in X-direction of the partitioned stacked body is about 2 mm, for example, and the width in Y-direction is about 4 mm, for example. The region in which the insulating layer 400 is disposed, is also a region which can be cut by dicing. With consideration for the amount of losses of the insulating layer due to dicing and the breakdown voltage of the insulating layer to be a chip end, the insulating layer 400 at a place to be diced is formed so as to be comparatively thick (for example, 100-1000 μm). Further, the film thickness of the insulating layer 400 at a place not to be diced is made about 50 μm, for example.

Next, as represented in FIG. 4B, trenches 115 and 125 are formed by subjecting the structure body 150 to photolithography and RIE (Reactive Ion Etching), ion milling, etc. The width in Y-direction of the trenches 115 and 125 is 200 μm, for example.

The following manufacturing process is represented in FIG. 4C which is an enlarged view of a part indicated by an arrow P in FIG. 4B.

An insulating layer 113 is formed in the trench 115 by CVD (Chemical Vapor Deposition), etc. Here, the insulating layer 113 is formed so that the inside of the trench 115 is not fully buried with the insulating layer 113. That is, the insulating layer 113 is formed to such an extent that the inner wall of the trench 115 is covered with the insulating layer 113. Subsequently, a through electrode 110 is formed in the trench 115 via the insulating layer 113. In the same way, an insulating layer 123 and a through electrode 120 are also formed in the trench 125. The thickness in Y-direction of the insulating layers 113 and 123 is 50 μm, for example. The thickness in Y-direction of the through electrodes 110 and 120 is 100 μm, for example. The through electrodes 110 and 120 are formed by CVD (Chemical Vapor Deposition), or plating, etc., for example.

Figure 5A:
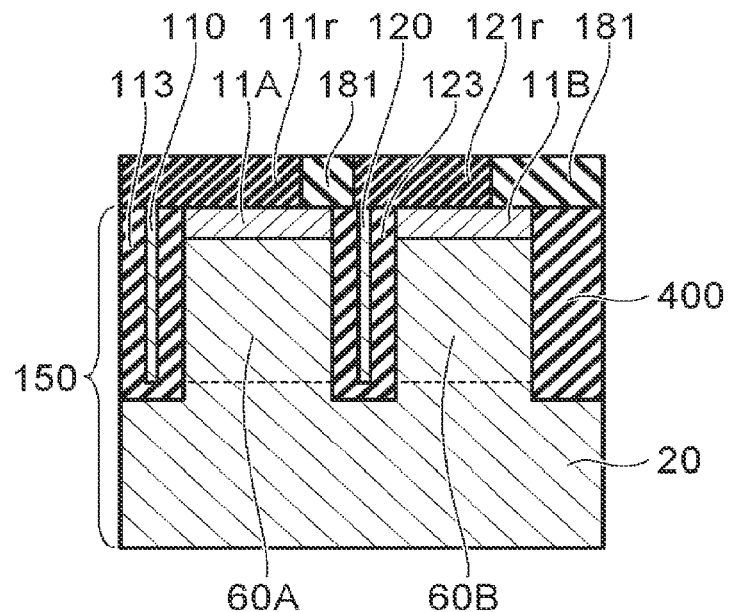
FIGS. 5A to 5C are schematic cross-sectional views showing the manufacturing process of the semiconductor device according to the first embodiment.
Figure 5B:
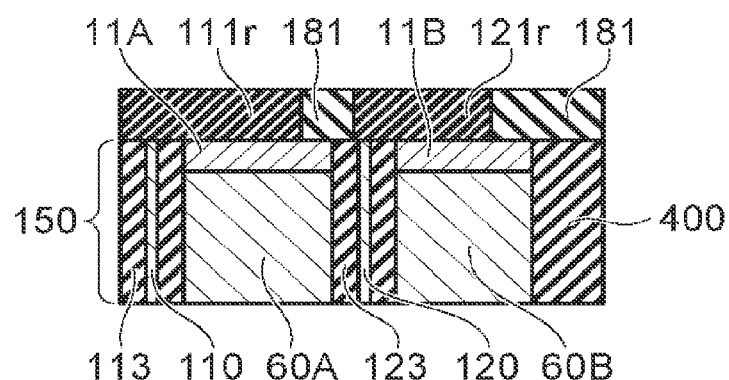
Figure 5C:
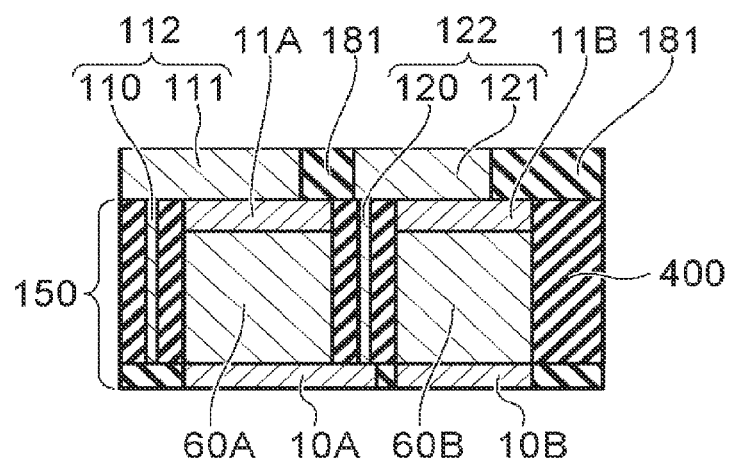

FIGS. 5A to 5C are schematic cross-sectional views showing the manufacturing process of the semiconductor device according to the first embodiment.

In FIG. 5A, a cross-section cut along line A-B in FIG. 4C is represented. Where, the upper side in FIG. 5A is defined as the surface side of the semiconductor device, and the lower side in FIG. 5A is defined as the rear surface side of the semiconductor device.

The through electrode 120 is connected to the source electrode 11B. The through electrode 110 is connected to the source electrode 11A. In this stage, on lower sides of the drift regions 20A and 20B and the through electrode 110 and 120, an n-type semiconductor layer 20 connected to the drift region 20A and 20B is present. The semiconductor layer 20 is a semiconductor substrate, and if its material is SiC, has a thickness of about 350 μm. In other words, before the process in FIG. 4A, the semiconductor layer 20 as a semiconductor substrate is subjected to a Wafer Process, and the structure body 150 including the semiconductor layer 20 is prepared. Further, an insulating layer 181 and resist layers 111r and 121r are formed on the structure body 150.

Next, as represented in FIG. 5B, by polishing the rear surface (using for example, chemical mechanical polishing etc.) the semiconductor layer 20 is removed from the structure body 150. As a result, lower ends of the through electrodes 110 and 120 are exposed from the structure body 150. Further, the insulating layers 400, 113, and 123 are also exposed. Any one of the insulating layers 400, 113, and 123 can be used as an alignment mark in an exposure process of the post-processes.

Further, after removing the semiconductor layer 20, buffer regions 25A and 25B may be formed on the rear surfaces of the semiconductor containing layers 60A and 60B by injecting n-type impurity elements from the rear surfaces of the semiconductor containing layers 60A and 60B, respectively.

Next, as represented in FIG. 5C, the drain electrode 10A to be connected to the lower end of the through electrode 120 is formed on the lower side of the structure body 150. Further, by removing the resist layer 111r, an electrode 111 is formed on the removed position. Furthermore, by removing the resist layer 121r, an electrode 121 is formed on the removed position. As a result, contact regions 112 and 122 are formed.

After that, as represented in FIG. 1B, a capacitive element section 203 is connected between the source electrode 11A and the drain electrode 10B. A dielectric body 202 included in the capacitive element section 203 is disposed to the lower side of the drain electrode 10A or drain electrode 10B.

In a dicing process, the part to be diced can be chosen arbitrarily. That is, a semiconductor device 1 where only two semiconductor elements 100 are included in one chip may be formed, and a semiconductor device 1 where plural sets of two semiconductor elements 100 exist in one chip may be formed. When the semiconductor device 1 where plural sets of two semiconductor elements 100 exist in one chip is formed, the manufacturing cost is reduced due to decrease in number of times of dicing processing. The n-type semiconductor layer 20 (semiconductor substrate), if its material is SiC, for example, has a thickness of about 350 μm. In this embodiment, the semiconductor substrate is treated as a single body, enabling to subject it to various semiconductor processes, by leaving a part of the rear face side (for example, about 100 μm if SiC) to dig a trench structure and to bury thereon an insulating film, a metal film (through electrode), or the like.

Figure 6:
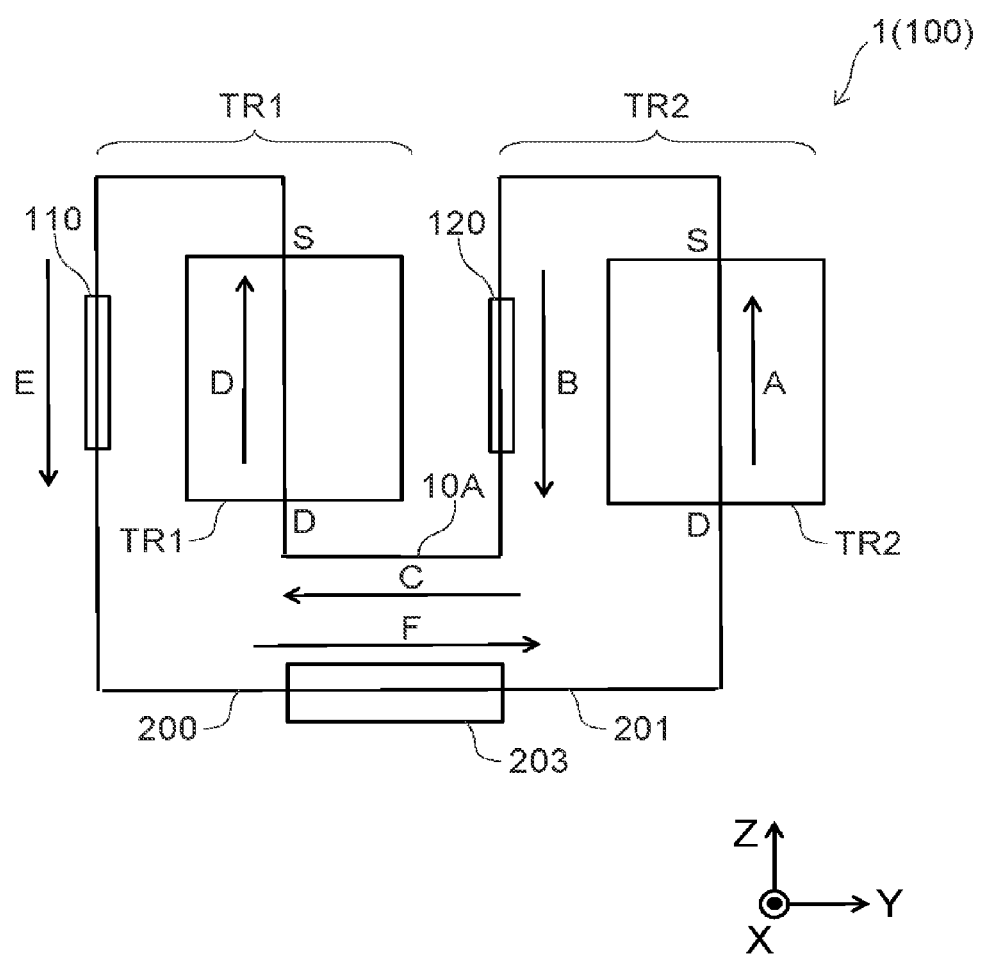
FIG. 6 is a schematic diagram showing current flows in a semiconductor element according to the first embodiment.

FIG. 6 is a schematic diagram showing current flows in the semiconductor element according to the first embodiment.

The way how current flows in the semiconductor element 100 is represented schematically by a "line". The line is bent in some places. Further, the direction to which current flows is represented by arrows.

In the semiconductor element 100, when a transistor section TR1 and a transistor section TR2 are in ON state, a direction A of current flowing to the source electrode 11B from the drain electrode 10B of the transistor section TR2 and a direction B of current flowing via the through electrode 120 become opposite to each other. Further, a direction D of current flowing to the source electrode 11A from the drain electrode 10A of the transistor section TR1 and a direction E of current flowing via the through electrode 110 become opposite to each other. Furthermore, a direction C of current flowing via the drain electrode 10A and a direction F of currents flowing via the electrodes 200 and 203 of the capacitive element section 203 become opposite to each other.

As a result, the direction of magnetic flux generated by the current in a direction A and the direction of magnetic flux generated by the current in a direction B cancel out each other. Further, the direction of magnetic flux generated by the current in a direction D and the direction of magnetic flux generated by the current in a direction E cancel out each other. Furthermore, the direction of magnetic flux generated by the current in a direction C and the direction of magnetic flux generated by the current in a direction F cancel out each other.

That is, within the semiconductor element 100, magnetic fluxes oriented in opposite directions cancel out each other, and the parasitic inductance in the semiconductor element 100 decreases. As a result, an induced voltage generated in the semiconductor device 1 decreases.

Further, the semiconductor element 100 is provided with the through electrode 120, and the path of current flowing to the drain electrode 10A from the source electrode 11A is located between the semiconductor containing layer 60A and the semiconductor containing layer 60B, thereby, the current path becomes shorter than usual. As a result, downsizing of the semiconductor element is enabled.

Further, due to decrease of the parasitic inductance in the semiconductor element 100, it is not necessary for the two semiconductor elements 100 to be provided with a magnetic shield function.

Further, according to the first embodiment, transistor sections TR1 and TR2, the capacitive element section 203, and the through electrodes 110 and 120 are formed in each semiconductor element 100 by a wafer process in a monolithic manner. Further, each of the semiconductor elements can be formed uniformly by a wafer process, resulting in decrease of variation in characteristics of each semiconductor element 100.

Further, according to the first embodiment, an electronic circuit can be formed by arranging diced pieces of semiconductor devices 1 on a support substrate. Therefore, when forming an electronic circuit, the manufacturing process becomes simple. Further, since the characteristics variation of each semiconductor device 1 decreases, the characteristics variation of the electronic circuit decreases.

Further, the breakdown voltage of the chip end of the semiconductor element 100 is adjusted by the thickness of the insulating layer 400 or the insulating layer 113. That is, it is not necessary for increasing the breakdown voltage of the chip end to form a complicated chip end structure. In addition, the thickness of the insulating layer 400 or the insulating layer 113 after diced, is adjusted to be not more than 500 μm, for example.

Further, according to the first embodiment, the drain electrode 10A and the source electrode 11B are not connected by a bonding wire, but instead they are connected via the through electrode 120 provided inside the semiconductor device 1. As a result, the current path between the drain electrode 10A and the source electrode 11B becomes shorter than usual.

Further, according to the first embodiment, since the capacitive element section 203 is disposed to the lower side of the drain electrode, even if another capacitive element section 203 is provided on the semiconductor element 100, a chip area does not increase.

First Modified Example of the First Embodiment

Figure 7A:
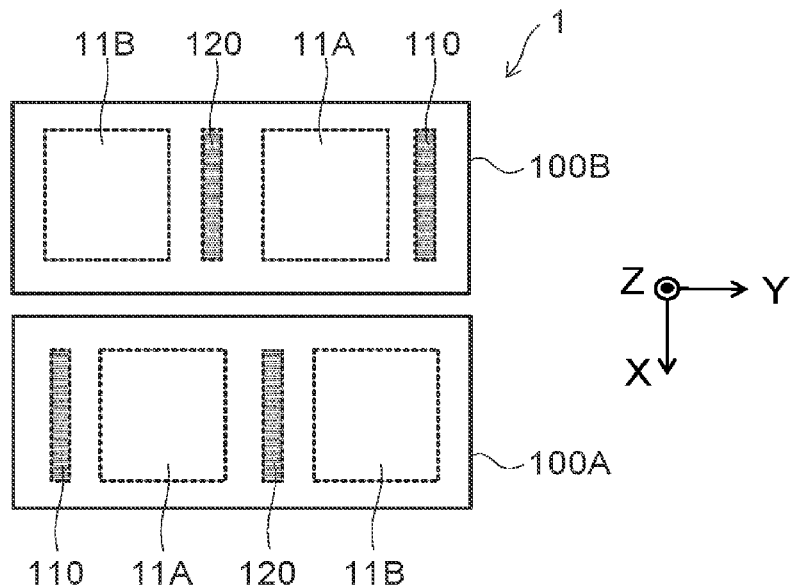
FIG. 7A is a schematic plan view showing a semiconductor device according to a first modified example of the first embodiment.
Figure 7B:
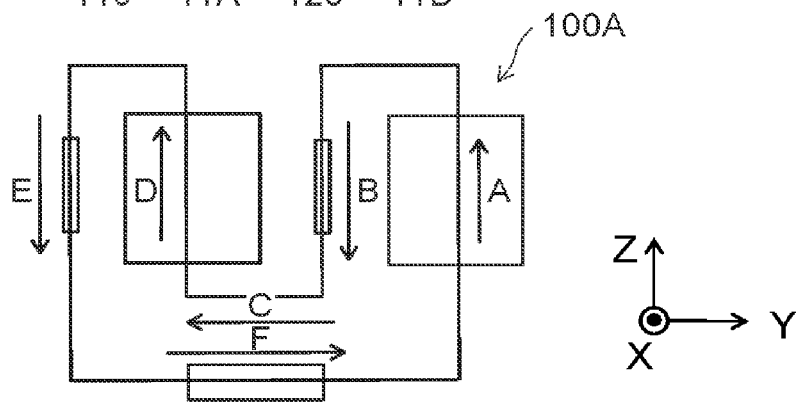
FIGS. 7B and 7C are schematic views showing flows in a semiconductor element according to the first modified example of the first embodiment.
Figure 7C:
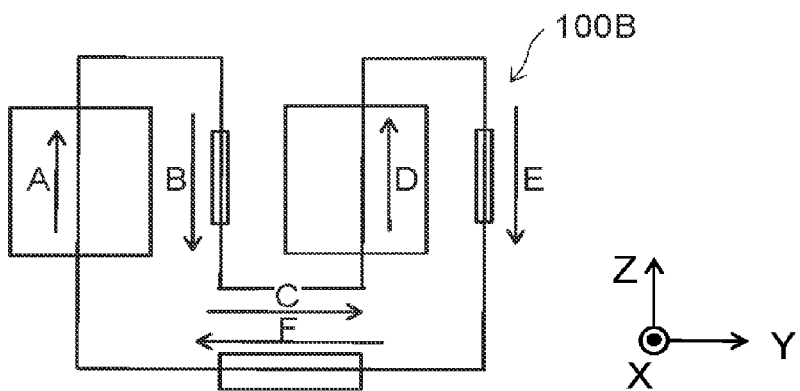

FIG. 7A is a schematic plan view showing a semiconductor device according to the first modified example of the first embodiment, and FIGS. 7B and 7C are schematic views representing current flows in a semiconductor element according to the first modified example of the first embodiment.

Figure 8:
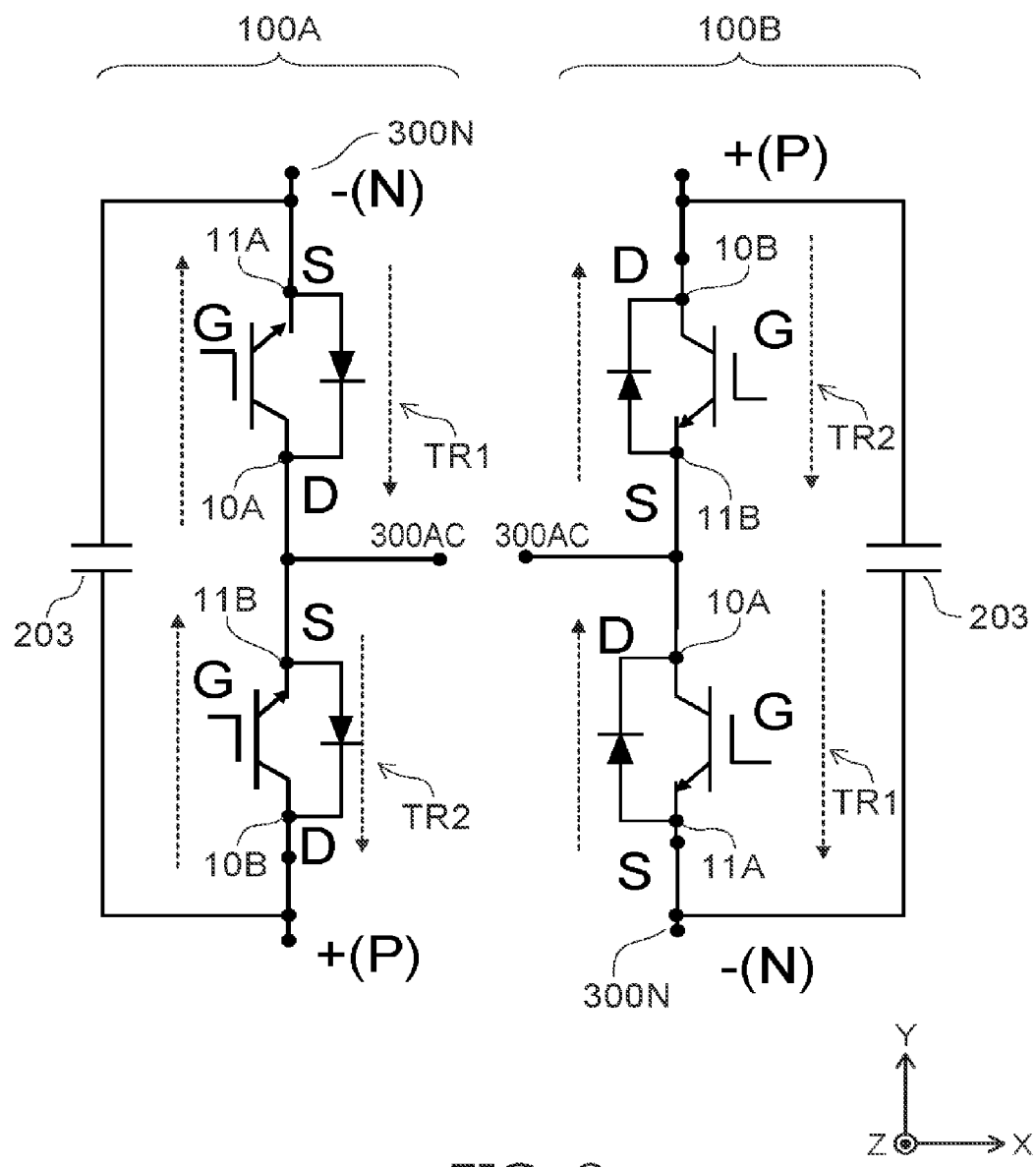
FIG. 8 is an equivalent circuit diagram of the semiconductor device according to the first modified example of the first embodiment.

FIG. 8 is an equivalent circuit diagram of the semiconductor device according to the first modified example of the first embodiment.

In a case of FIG. 7A, two semiconductor elements 100 (100A, 100B) are arranged adjacent to each other in X-direction, however, the directions of paths of current flowing from the source electrode 11A to the source electrode 11B (or the directions of paths of current flowing from the source electrode 11B to the source electrode 11A) is are opposite to each other in the semiconductor elements 100A, 100B. Further, by such a disposal, the position of the through electrode 120 and the position of the through electrode 110 shift alternately in Y-direction.

In FIG. 7B, the direction of current flow in the semiconductor element 100A is indicated, and in FIG. 7C, the direction of current flow in the semiconductor element 100B is shown.

By such a disposal, the direction of current flow in the in the semiconductor element 100A and the direction of current flow in the in the semiconductor element 100B is opposite to each other. A path length of current flowing in the semiconductor element 100A and a path length of current flowing in the semiconductor element 100B is equal to each other. As a result, the cancelling out effect of fluxes increases further. As a result, the parasitic inductance in the semiconductor device 1 decreases further.

Second modified Example of the First Embodiment

Figure 9A:
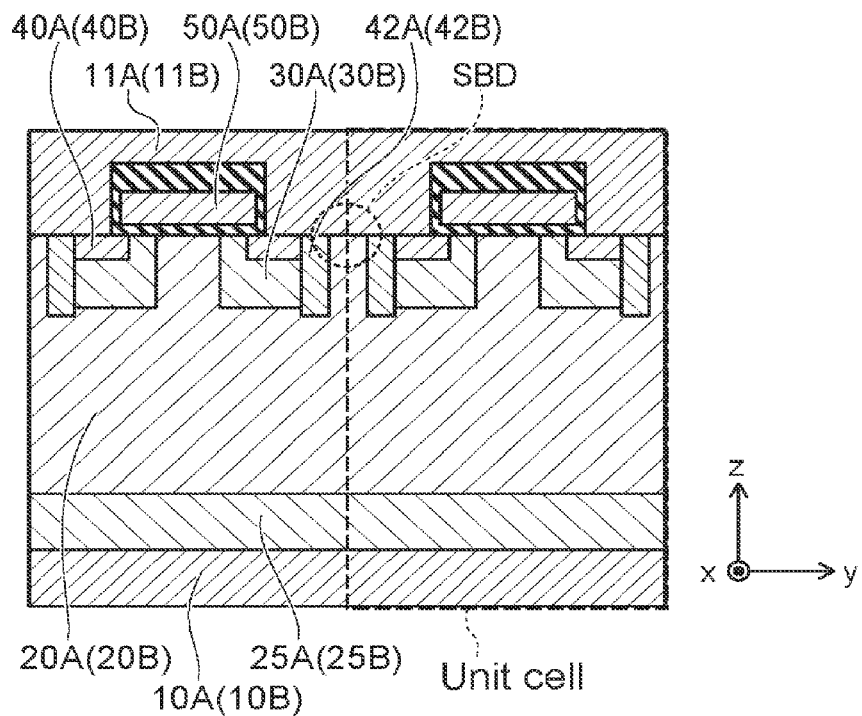
FIGS. 9A and 9B are schematic cross-sectional views showing an internal structure of a semiconductor device according to a second modified example of the first embodiment.
Figure 9B:
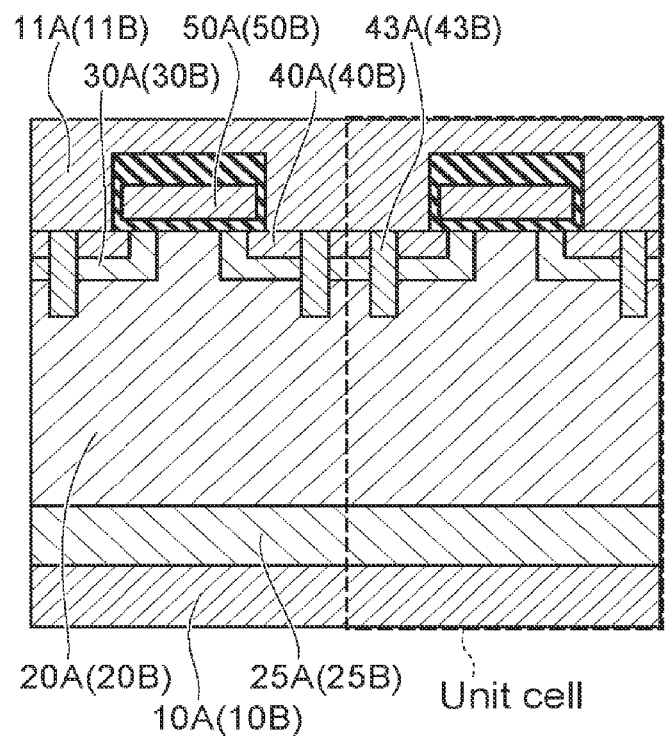

FIGS. 9A and 9B are schematic cross-sectional views showing the internal structure of a semiconductor device according to the second modified example of the first embodiment.

A MOSFET included in the transistor section TR1 (or TR2) is not restricted to the structure mentioned above.

For example, a MOSFET represented in FIG. 9A is provided with a $p^+$-type contact region 42A (or 42B). The contact region 42A (or 42B) is in contact with a source region 40A (or 40B), a base region 30A (or 30B), and a drift region 20A (or 20B).

In this MOSFET, a Schottky barrier diode (SBD) is formed with a junction between a source electrode 11A (or 11B) and a drift region 20A (or 20B). This Schottky barrier diode is a built-in diode of MOSFET. Further, a pn diode is also formed with a junction between the contact region 42A (or 42B) and the drift region 20A. That is, MOSFET represented in FIG. 9A has an MPS (Merged pn and Schottky Barrier) structure which is a combination of the Schottky barrier diode and the pn diode.

Further, the drift region 20A (or 20B) under the Schottky barrier diode (SBD) is sandwiched by a pair of the contact regions 42A (or 42B). The lower part of the contact region 42A (or 42B) is deeper than the lower part of the base region 30A (or 30B).

By such a structure, in an off state, a depletion layer spreads easily to the drift region 20A (or 20B) sandwiched by the contact regions 42A (or 42B). As a result, the reverse current of the Schottky barrier diode (SBD) is surely suppressed. Further, control of such a reverse current is adjusted by the length in z-direction of the contact region 42A (or 42B), and the width in y-direction.

Further, a MOSFET represented in FIG. 9B is provided with $p^+$-type contact region 43A (or 43B). The contact region 43A penetrates through the source region 40A (or 40B) and the base region 30A (or 30B), and is in contact with the drift region 20A (or 20B). In the MOSFET represented in FIG. 9B, a pn diode is formed with a junction between the contact region 43A (or 43B) and the drift region 20A (or 20B). The contact region 43A (or 43B) further extends to the drain electrode 10A (or 10B) side than in the state represented in FIG. 9A.

In the MOSFET represented in FIG. 9B, a pn diode is formed with a junction between the contact region 43A (or 43B) and the drift region 20A. The breakdown voltage in an OFF state is adjusted by a junction barrier of the pn diode. The junction barrier is adjusted by the depth of the contact region 43A (or 43B). A $p^-$-type thin film structure where the thickness of the $p^-$ portion between the junction barriers is thinner than that of the base region 30A (30B) is preferable. For example, in forming the base region 30A (30B) by ion implantation, it is possible to form a $p^-$ portion shallower than the base region 30A (30B) by changing the thickness of a through film.

The contact region 42A (or 42B) and the contact region 43A (or 43B) may extend in y-direction, or may be pillars extending in z-direction. Further, a plurality of junction barriers may be formed, for example, a plurality of pillars may be distributed in x and y-directions. In a case where the contact region 42A (or 42B) is a pillar, a cut surface formed in case of cutting the contact region 42A (or 42B) vertically with respect to z-direction may be circular or rectangular. Further, the contact region 42A (or 42B) may be disposed under the source region 40A (or 40B).

Second Embodiment

A modified example of a semiconductor element is illustrated below. Even if the semiconductor element illustrated below is used, the same effect as that of the first embodiment is obtained.

Figure 10A:
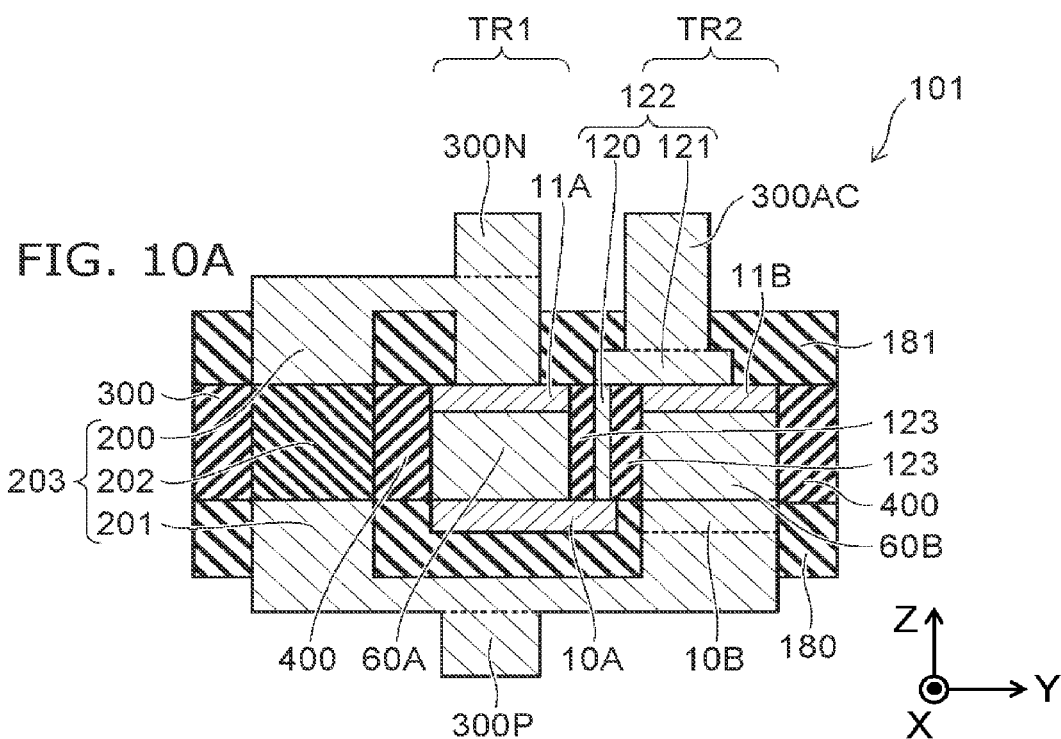
FIGS. 10A and 10B are schematic cross-sectional views showing a semiconductor device according to a second embodiment.
Figure 10B:
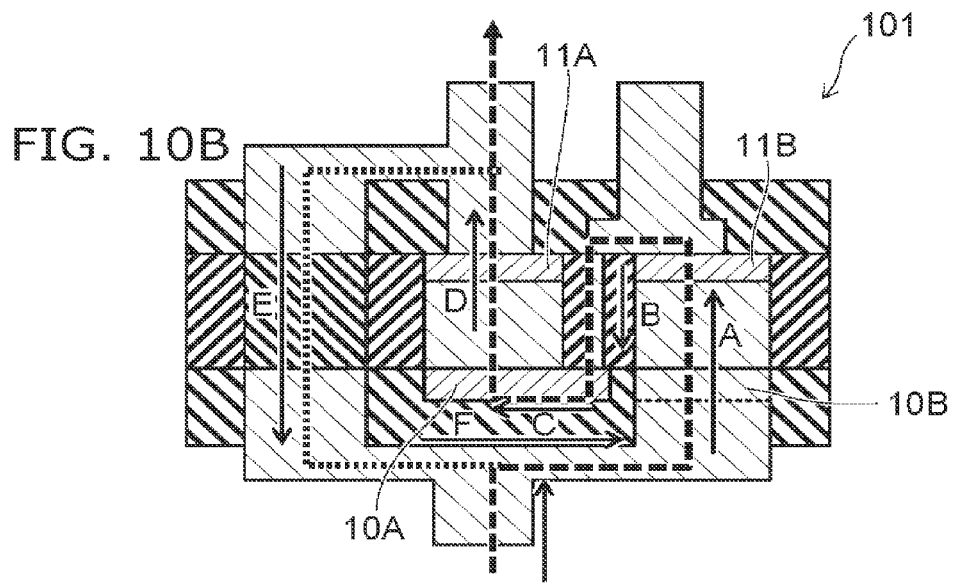

FIGS. 10A and 10B are schematic cross-sectional views showing a semiconductor device according to the second embodiment.

As represented in FIG. 10A, in a semiconductor device 101, a capacitive element section 203 is also connected between a source electrode 11A and a drain electrode 10B. However, in the semiconductor device 101, a dielectric body 202 included in the capacitive element section 203 is aligned with a transistor section TR1 or transistor section TR2 in Y-direction. For example, the dielectric body 202 is aligned with the transistor section TR1 on the side opposite to the transistor section TR2.

Here, the source electrode 11A is connected to an electrode 200 provided above the source electrode 11A. The electrode 200 being in contact with the source electrode 11A extends upward from the source electrode 11A, extends in Y-direction, and further extends to the side of the drain electrode 10A. Further, the drain electrode 10B is connected to an electrode 201 provided below the drain electrode 10B. The electrode 201 being in contact with the drain electrode 10B extends downward from the drain electrode 10B, extends in Y-direction, and further extends to the side of the source electrode 11A. Further, a dielectric body 202 is provided between the electrode 201 and the electrode 202.

A DC terminal 300N is drawn out from the electrode 200, and a DC terminal 300P is drawn out from the electrode 201. An AC terminal 300AC is drawn out from an electrode 121. The AC terminal 300AC may be electrically connected to the drain electrode 10A instead of the source electrode 11B.

Semiconductor containing layers 60A and 60B, the source electrodes 11A and 11B, the drain electrodes 10A and 10B, and the dielectric body 202 are covered with the insulating layers 400, 123, 180, and 181.

Further, positions at which a through electrodes 120, the source electrodes 11A and 11B, the drain electrodes 10A and 10B, and the dielectric body 202 are disposed are not limited to the positions shown in the figure, but they may be changed as appropriate in X and Y-directions.

Further, when a cut surface formed in case of cutting the drift regions 20A and 20B vertically with respect to Z-direction is viewed, the drift regions 20A and 20B are surrounded by the insulating layer 400.

The current path of the semiconductor element 101 is shown in FIG. 10B.

In the semiconductor element 101, when a transistor section TR1 and a transistor section TR2 are in ON state, a direction A of current flowing to the source electrode 11B from the drain electrode 10B of the transistor section TR2 and a direction B of current flowing via the through electrode 120 become opposite to each other. Further, a direction D of current flowing to the source electrode 11A from the drain electrode 10A of the transistor section TR1 and a direction E of current flowing via the electrodes 200 and 201 become opposite to each other. Furthermore, a direction C of current flowing via the drain electrode 10A and a direction F of currents flowing via the electrode 201 become opposite to each other.

As a result, the direction of magnetic flux generated by the current in direction A and the direction of magnetic flux generated by the current in direction B cancel out each other. Further, the direction of magnetic flux generated by the current in direction D and the direction of magnetic flux generated by the current in direction E cancel out each other. Furthermore, the direction of magnetic flux generated by the current in direction C and the direction of magnetic flux generated by the current in direction F cancel out each other.

That is, within the semiconductor element 101, magnetic fluxes oriented in opposite directions cancel out each other, and the parasitic inductance in the semiconductor element 101 decreases. As a result, an induced voltage generated in the semiconductor device 1 decreases.

Further, the semiconductor element 101 is provided with the through electrode 120, and the path of current flowing to the drain electrode 10A from the source electrode 11A is located between the semiconductor containing layer 60A and the semiconductor containing layer 60B, thereby, the current path becomes shorter than usual. As a result, downsizing of the semiconductor element is enabled.

Figure 11A:
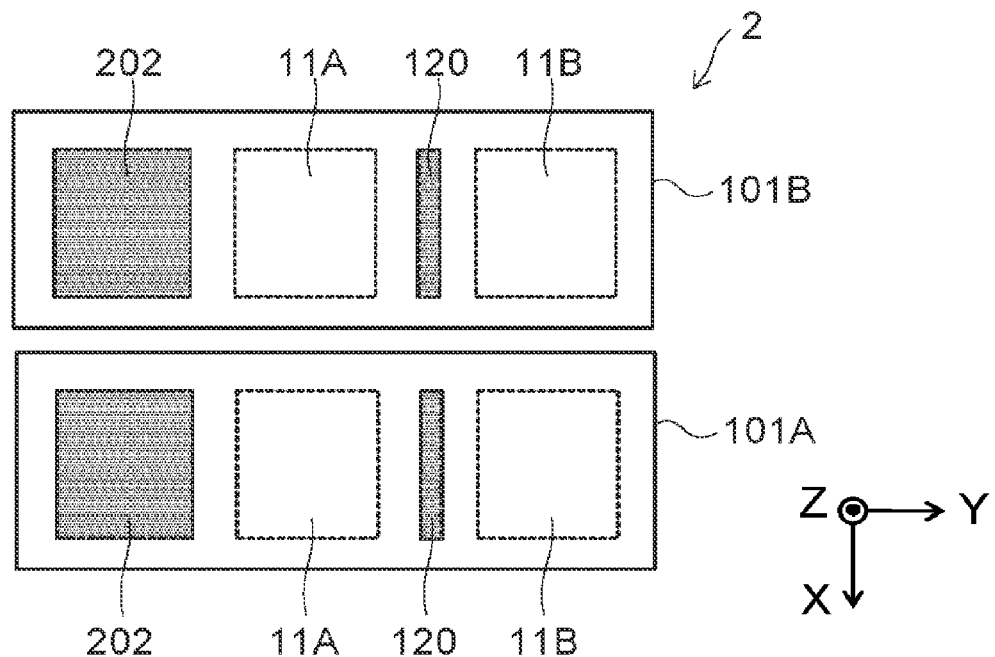
FIGS. 11A and 11B are schematic plan views showing the semiconductor device according to the second embodiment.
Figure 11B:
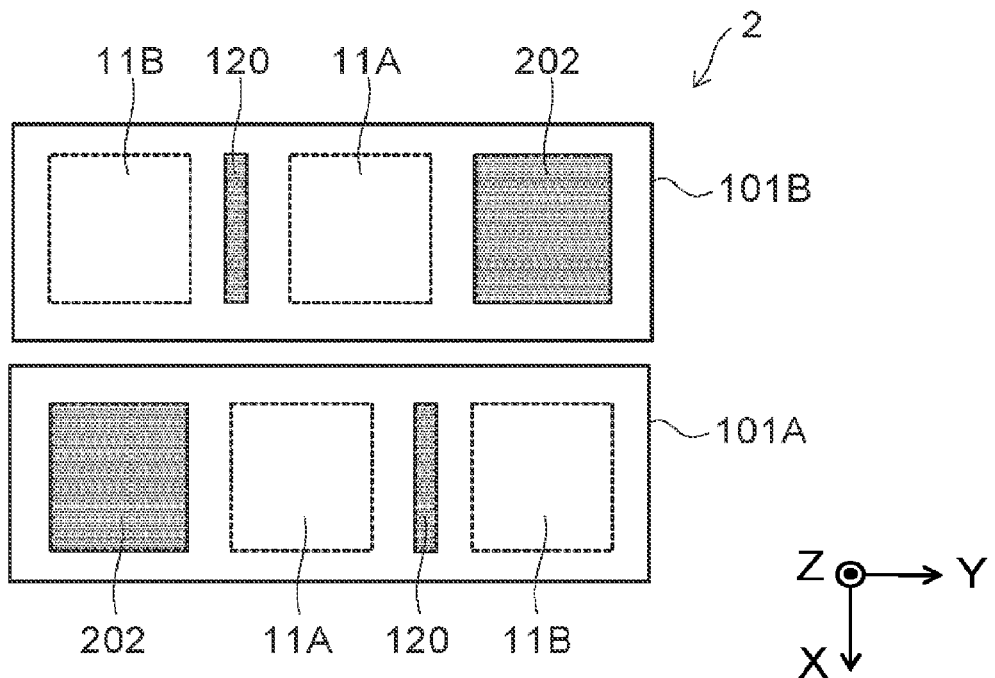

FIGS. 11A and 11B are schematic plan views showing the semiconductor device according to the second embodiment.

In the semiconductor device 2, two semiconductor elements 101 (101A and 101B) are arranged adjacent to each other in X-direction. A direction from the source electrode 11A toward the source electrode 11B in each of the two semiconductor elements 101A and 101B may be the same one as represented in FIG. 11A, alternatively, the direction may be opposite to each other as represented in FIG. 11B.

FIGS. 12A to 12C are schematic cross-sectional views showing the manufacturing process of the semiconductor device according to the second embodiment.

First, a structure body 151 represented in FIG. 12A is prepared. In the structure body 151, on the side below the drift regions 20A and 20B and the through electrode 120, there is a semiconductor layer 20 connected to the drift regions 20A and 20B. The through electrode 120 is connected to the source electrode 11B. Further, in this stage, a dielectric body 202 is formed beside a semiconductor containing layer 60A. A portion of an electrode 200 is provided on the dielectric body 202 and the source electrode 11A.

Next, as represented in FIG. 12B, by polishing the rear surface of the structure body 151, the semiconductor layer 20 is removed from the structure body 151. As a result, the lower end of the through electrode 120 is exposed from the structure body 151. Further, the insulating layer 400 is also exposed.

Further, after removing the semiconductor layer 20, buffer regions 25A and 25B may be formed on the rear surfaces of the semiconductor containing layers 60A and 60B by injecting n-type impurity elements from the rear surfaces of the semiconductor containing layers 60A and 60B, respectively.

Next, as represented in FIG. 12C, the drain electrode 10A to be connected to the lower end of the through electrode 120 is formed on the lower side of the structure body 151. Further, a drain electrode 10B is formed. Furthermore, a portion of the electrode 201 to be connected to the dielectric body 202 is formed. Subsequently, as represented in FIG. 10A, the electrodes 200 and 201 are formed.

Third Embodiment

FIG. 13 is a schematic cross-sectional view showing a semiconductor element according to the third embodiment.

Further, as a capacitive element section electrically connected between a source electrode 11A and a drain electrode 10B, as represented in FIG. 13, an external capacitive element 205 may be used.

Fourth Embodiment

FIG. 14 is a schematic plan view showing a semiconductor device according to a first example of the fourth embodiment.

Although, in FIG. 1B mentioned above, a state where two semiconductor elements 100 composing one set arranged adjacent to each other in X-direction is represented, as represented in FIG. 14, semiconductor elements 100 composing two or more sets may be arranged adjacent to one another.

Here, each of source electrodes 11A is commonly connected to a wiring 160 (first wiring). Each of drain electrodes 10B is commonly connected to a wiring 161 (second wiring). Each of AC terminals 300AC is commonly connected to a wiring 162 (third wiring). Further, a DC current is applied between the wiring 160 and the wiring 161, and an AC voltage is outputted from the wiring 162.

The semiconductor element 101 may be used instead of the semiconductor element 100. Thus, by locating not less than two semiconductor elements adjacent to one another, the value of current i (di/dt) flowing through the wirings is decreased, enabling a low loss state.

Further, since the current value becomes small and the frequency becomes high, required electric charges become small and a required capacitor capacity becomes small. As a result, although a conventional inverter module required a big capacitor thereby with a huge inverter module, in this example, it is possible to mount a small capacitor in a monolithic manner, enabling downsizing of the inverter module. Further, by making the inverter module in a monolithic manner on a semiconductor substrate, the length of wirings becomes short and the inductance also becomes small, thereby, enabling to use higher frequency. Thus, a low inductance, small capacitor capacity, and small sized inverter module capable of high speed operation is enabled.

Figure 15:
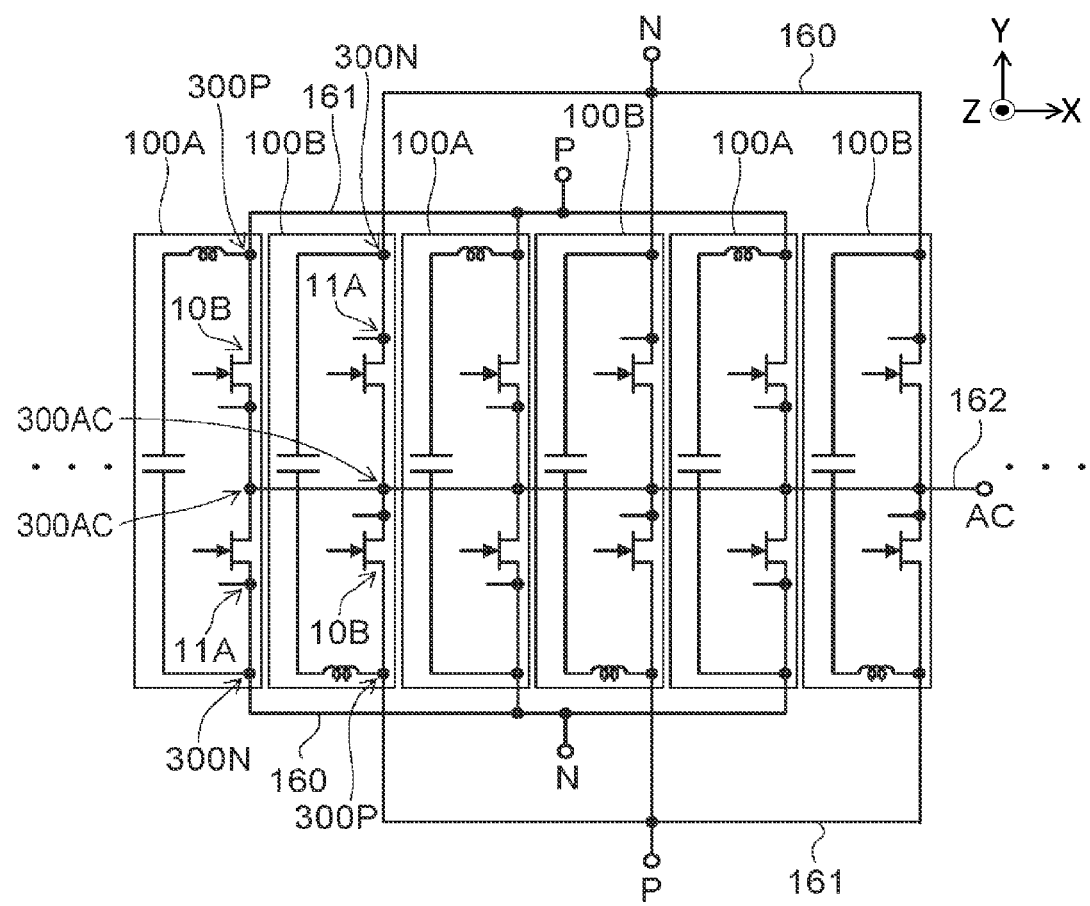
FIG. 15 is a schematic plan view showing a semiconductor device according to a second example of the fourth embodiment.

FIG. 15 is a schematic plan view showing a semiconductor device according to a second example of the fourth embodiment.

On the other hand, although, in FIG. 7A mentioned above, a state where two semiconductor elements 100 (100A and 100B) composing one set are arranged adjacent to each other in X-direction is represented, as represented in FIG. 15, semiconductor elements 100 (100A and 100B) composing not less than two sets may be located in parallel. The semiconductor element 101 may be used instead of the semiconductor element 100.

Further, by locating a plurality of semiconductor elements as FIGS. 14 and 15, total inductance becomes lower. This is because a low inductance state is enabled in a manner inversely proportional to the parallel number due to the fact that a loop area is made small by breaking the semiconductor elements in parallel to make current per semiconductor element small and by making respective circuit loops in a monolithic manner to bend the loops. That is, as the parallel number increases, the lower induction state will be enabled.

Here, each of the semiconductor elements has structures shown as FIGS. 7A, 11A and 11B. Each of the negative DC terminal 300N, which is connected to the source electrode 11A, the positive DC terminal 300P, which is connected to the drain electrode 10B, and the AC terminal 300AC, which is connected to the through electrode 120 is drawn out to one surface side of the semiconductor element.

For example, in a conventional module, the positive terminal and the negative terminal are disposed alternately in the case that the directions from the source electrode 11A to the drain electrode 10B are opposite to each other, shown as FIG. 15 etc. This causes a generation of parasitic inductance newly due to the drawn out interconnections connected to the source electrode 11A or the drain electrode 10B.

In contrast, each of the terminals is drawn out to one surface side of the semiconductor element in the fourth embodiment. Therefore, the generation of parasitic inductance due to the drawn out interconnections can be minimized.

On the contrary, since a large current is treated with one big capacitor without using parallel capacitors, the conventional inverter module had been large with a high inductance, a large capacitor capacity, and a low speed operation.

Fifth Embodiment

Figure 16:
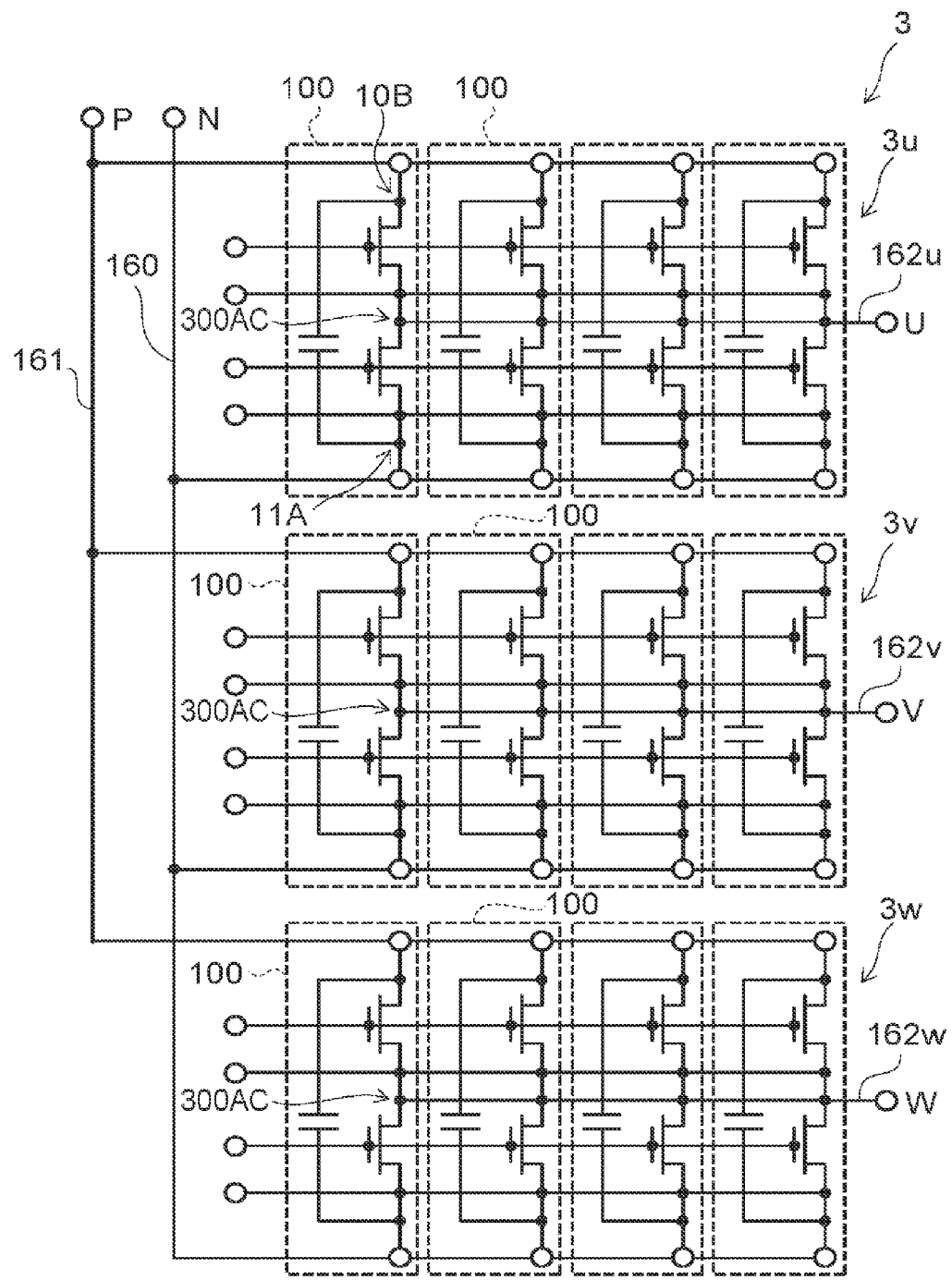
FIG. 16 is a schematic plan view showing a semiconductor device according to a fifth embodiment.

FIG. 16 is a schematic plan view showing a semiconductor device according to the fifth embodiment.

Further, a plurality of semiconductor elements 100 may be divided into each unit to constitute a three-phase inverter.

For example, as represented in FIG. 16, in a semiconductor device 3, at least one pair of (for example, not less than two) the set of semiconductor elements is disposed in each of a first circuit unit 3$u$, a second circuit unit 3$v$, and a third circuit unit 3$w$. Here, each of source electrodes 11A is commonly connected to a wiring 160. Further, each of drain electrodes 10B is commonly connected to the wiring 161.

However, in the first circuit unit 3$u$, each of electrode terminals 300AC is commonly connected to a wiring 162$u$. Further, in the second circuit unit 3$v$, each of electrode terminals 300AC is commonly connected to a wiring 162$v$. Further, in the third circuit unit 3$w$, each of electrode terminals 300AC is commonly connected to a wiring 162$w$. In addition, the phases of voltages respectively outputted from the wirings 162$u$ in the first circuit unit 3$u$, 162$v$ in the second circuit unit 3$v$, and 162$w$ in the third circuit unit 3$w$ are different to each other. For example, a phase shift between voltages respectively outputted from the wirings 162$u$, 162$v$ and 162$w$ is set to be 120 degrees.

In the above-mentioned embodiments, in a representation of "part A is provided on part B", "on" may also mean a case where part A is provided above part B, not only a case where part A is provided on part B while being in contact with part B. Further, "part A is provided on part B" may be applied for a case where part A is located below part B by reversing part A and part B, or a case where part A and part B are disposed side by side. This is because even when a semiconductor device according to the embodiments is rotated, the structure of the semiconductor device does not change.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor element comprising:
   a first transistor section including
      a first electrode,
      a second electrode,
      a first conductivity-type first semiconductor region provided between the second electrode and the first electrode,
      a second conductivity-type second semiconductor region provided between the first semiconductor region and the second electrode,
      a first conductivity-type third semiconductor region provided between the second semiconductor region and the second electrode, the third semiconductor region having an impurity concentration higher than an impurity concentration of the first semiconductor region, and the third semiconductor region being connected to the second electrode, and
      a third electrode sandwiching a first insulating film with the first semiconductor region, the second semiconductor region and the third semiconductor region;
   a second transistor section including
      a fourth electrode arranged adjacent to the first electrode in a first direction, a fifth electrode arranged adjacent to the second electrode in the first direction, a first conductivity-type fourth semiconductor region provided between the fifth electrode and the fourth electrode, a second conductivity-type fifth semiconductor region provided between the fourth semiconductor region and the fifth electrode, a first conductivity-type sixth semiconductor region provided between the fifth semiconductor region and the fifth electrode, the sixth semiconductor region having an impurity concentration higher than an impurity concentration of the fourth semiconductor region, and the sixth semiconductor region being connected to the fifth electrode, and a sixth electrode sandwiching a second insulating film with the fourth semiconductor region, the fifth semiconductor region and the sixth semiconductor region, the second transistor section being arranged adjacent to the first transistor section in the first direction;

a contact region including a seventh electrode extended in a second direction intersecting with the first direction and the seventh electrode provided between the first semiconductor region and the fourth semiconductor region, the contact region electrically connecting the fifth electrode and the first electrode; and a capacitive element section connected between the second electrode and the fourth electrode.

2. The element according to claim 1, wherein the seventh electrode is provided between the first transistor section and the second transistor section.

3. The element according to claim 1, wherein a dielectric body included in the capacitive element section is located on a lower side of the first electrode or the fourth electrode.

4. The element according to claim 1, further comprising an eighth electrode provided beside the first transistor section and extended in the second direction, wherein the eighth electrode is electrically connected to the second electrode, and the capacitive element section is connected between the second electrode and the fourth electrode via the eighth electrode.

5. The element according to claim 1, wherein a dielectric body included in the capacitive element section is arranged adjacent to the first transistor section in the first direction.

6. The element according to claim 5, wherein the dielectric body is arranged adjacent to the first transistor section on a side opposite to the second transistor section.

7. The element according to claim 1, wherein the first semiconductor region and the fourth semiconductor region are surrounded by an insulating layer when a cut surface by cutting the first semiconductor region and the fourth semiconductor region vertically to the second direction is viewed.

8. A semiconductor device comprising a plural of sets of semiconductor elements, the semiconductor elements each including:

a first transistor section including
a first electrode,
a second electrode,
a first conductivity-type first semiconductor region provided between the second electrode and the first electrode,
a second conductivity-type second semiconductor region provided between the first semiconductor region and the second electrode,
a first conductivity-type third semiconductor region provided between the second semiconductor region and the second electrode, the third semiconductor region having an impurity concentration higher than an impurity concentration of the first semiconductor region, and the third semiconductor region being connected to the second electrode, and a third electrode sandwiching a first insulating film with the first semiconductor region, the second semiconductor region and the third semiconductor region;

a second transistor section including
a fourth electrode arranged adjacent to the first electrode in a first direction,
a fifth electrode arranged adjacent to the second electrode in the first direction,
a first conductivity-type fourth semiconductor region provided between the fifth electrode and the fourth electrode,
a second conductivity-type fifth semiconductor region provided between the fourth semiconductor region and the fifth electrode,
a first conductivity-type sixth semiconductor region provided between the fifth semiconductor region and the fifth electrode, the sixth semiconductor region having an impurity concentration higher than an impurity concentration of the fourth semiconductor region, and the sixth semiconductor region being connected to the fifth electrode, and
a sixth electrode sandwiching a second insulating film with the fourth semiconductor region, the fifth semiconductor region and the sixth semiconductor region, the second transistor section being arranged adjacent to the first transistor section in the first direction;

a contact region including a seventh electrode extended in a second direction intersecting with the first direction and provided between the first semiconductor region and the fourth semiconductor region, the contact region electrically connecting the fifth electrode and the first electrode; and a capacitive element section connected between the second electrode and the fourth electrode, the sets of semiconductor elements being arranged adjacent to one another in a third direction intersecting with the first direction and the second direction;

in each of semiconductor elements, a direction of path of current flowing from the fifth electrode to the second electrode being the same or opposite to each other;

a potential of a first polarity being applied to the second electrode of the each of semiconductor elements; and a potential of a second polarity opposite to the first polarity being applied to the fourth electrode of the each of semiconductor elements.

9. The device according to claim 8, wherein when the directions of the paths of current flowing from the fifth electrode to the second electrode are opposite to each other in the each of semiconductor elements, a position of the seventh electrode included in the each of semiconductor element of the sets is shifted alternately in the first direction.

10. The device according to claim 8, further comprising an electrode terminal electrically connected to the first electrode or the fifth electrode, wherein:

a plurality of the sets of semiconductor elements are arranged adjacent to one another in the third direction;

each of the second electrodes is commonly connected to a first wiring;

each of the fourth electrodes is commonly connected to a second wiring; and each of the electrode terminals is commonly connected to a third wiring.

11. The device according to claim 8, further comprising an electrode terminal electrically connected to the first electrode or the fifth electrode, wherein:
- at least one pair of the semiconductor elements is disposed in each of a first circuit unit, a second circuit unit, and a third circuit unit;
- each of the second electrodes is commonly connected to a first wiring;
- each of the fourth electrodes is commonly connected to a second wiring;
- each of the first circuit unit, the second circuit unit, and the third circuit unit has a third wiring;
- each of the electrode terminal provided in each of the first circuit unit, the second circuit unit, and the third circuit unit is commonly connected to the third wiring for every circuit unit; and
- voltages outputted from the third wiring of the first circuit unit, the third wiring of the second circuit unit, and the third wiring of the third circuit unit differ in phase.

12. The device according to claim 8, wherein the seventh electrode is provided between the first transistor section and the second transistor section.

13. The device according to claim 8, wherein the dielectric body included in the capacitive element section is located on a lower side of the first electrode or the fourth electrode.

14. The device according to claim 8, including an eighth electrode provided beside the first transistor section and extended in the second direction, wherein
- the eighth electrode is electrically connected to the second electrode, and
- the capacitive element section is connected between the second electrode and the fourth electrode via the eighth electrode.

15. The device according to claim 8, wherein the dielectric body included in the capacitive element section is arranged adjacent to the first transistor section in the first direction.

16. The device according to claim 15, wherein the dielectric body is arranged adjacent to the first transistor section on a side opposite to the second transistor section.

* * * * *